(12) United States Patent
Bordignon et al.

(10) Patent No.: US 10,153,779 B1
(45) Date of Patent: Dec. 11, 2018

(54) CONTENT-AWARE COMPRESSION OF FLOATING-POINT TIME-SERIES DATA USING MULTIPLE PREDICTION FUNCTIONS AND ESTIMATED BIT-SAVING THRESHOLDS

(71) Applicant: EMC IP Holding Company LLC, Hopkinton, MA (US)

(72) Inventors: Alex Laier Bordignon, Niterói (BR); Marcello Luiz Rodrigues de Campos, Niterói (BR); Angelo E. M. Ciarlini, Rio de Janeiro (BR); Rômulo Teixeira de Abreu Pinho, Niterói (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/496,528

(22) Filed: Apr. 25, 2017

(51) Int. Cl.
*H03M 7/30* (2006.01)
*G06F 7/483* (2006.01)

(52) U.S. Cl.
CPC ............. *H03M 7/30* (2013.01); *G06F 7/483* (2013.01)

(58) Field of Classification Search
CPC ................................ H03M 7/30; G06F 7/483
USPC .......................................................... 708/203
See application file for complete search history.

(56) References Cited

U.S. PATENT DOCUMENTS

| | | | |
|---|---|---|---|
| 2009/0289819 A1* | 11/2009 | Mahoney | H03M 7/24 341/51 |
| 2011/0279293 A1* | 11/2011 | Deslandes | G06T 9/00 341/87 |

OTHER PUBLICATIONS

U.S. Appl. No. 14/579,130, filed Dec. 22, 2014, entitled "Content-Aware Lossless Compression and Decompression of Floating Point Data".
U.S. Appl. No. 15/080,751, filed Mar. 25, 2016, entitled "Content-Aware Compression of Data Using Multiple Parallel Prediction Functions".
U.S. Appl. No. 15/189,318, filed Jun. 22, 2016, entitled "Content-Aware Compression of Data Using Window-Based Selection from Multiple Prediction Functions".

(Continued)

*Primary Examiner* — Tan V Mai
(74) *Attorney, Agent, or Firm* — Ryan, Mason & Lewis, LLP

(57) ABSTRACT

Methods and apparatus are provided for content-aware compression of data using multiple prediction functions. An exemplary method comprises obtaining a floating point number; applying a default prediction algorithm and at least one other distinct prediction algorithm to the obtained floating point number to generate a plurality of predictions; determining a residual for each prediction based on a difference between the predictions and the floating point number; determining a bit savings estimate for each prediction based on a difference between an exponent of each prediction and an exponent of the residual for each prediction; selecting the default prediction algorithm or one other distinct prediction algorithm for encoding the floating point number based on the determined bit savings estimate for each prediction; and encoding the floating point number by encoding the determined residual associated with the selected prediction algorithm and/or the determined bit savings estimate associated with the selected prediction algorithm.

20 Claims, 7 Drawing Sheets

(56) References Cited

OTHER PUBLICATIONS

U.S. Appl. No. 15/363,328, filed Nov. 29, 2016, entitled "Content-Aware Compression of Data Using Selection From Multiple Weighted Prediction Functions".
U.S. Appl. No. 14/867,329, filed Sep. 28, 2015, entitled "Distributed Content-Aware compression and Decompression of Data".
U.S. Appl. No. 14/230,510, filed Mar. 31, 2014, entitled "Heteroscedastic Data Compression Using Arima-Garch Model Estimation".
G. Mandyam et al., "Lossless Seismic Data Compression Using Adaptive Linear Prediction," in Geoscience and Remote Sensing Symposium (1996).

* cited by examiner $s_i = 13.71875 = (-1)^0 \times 1.1011011\underbrace{000000000000000}_{\text{trailing zeros}} \times 2^3$ $P(s_i) = 13.669921875 = (-1)^0 \times 1.10110100111\underbrace{0000000000000}_{\text{trailing zeros}} \times 2^3$   310

$P'(s_i) = 13.625 = (-1)^0 \times 1.1011010000000000000000 \times 2^3$   320

$e_i = s_i - P'(s_i) = 0.09375 = (-1)^0 \times 0.0000001\underbrace{1000000000000000}_{\text{trailing zeros (bit savings = 7 bits)}} \times 2^3$   330

$= (-1)^0 \times 1.1000000000000000000000 \times 2^{-4}$   340

FIG. 3

CONTENT-AWARE COMPRESSION OF FLOATING-POINT TIME-SERIES DATA USING MULTIPLE PREDICTION FUNCTIONS AND ESTIMATED BIT-SAVING THRESHOLDS

CROSS-REFERENCE TO RELATED APPLICATIONS

The present application is related to U.S. patent application Ser. No. 14/579,130, filed Dec. 22, 2014, now U.S. Pat. No. 9,660,666, entitled "Content-Aware Lossless Compression and Decompression of Floating Point Data;" U.S. patent application Ser. No. 15/080,751, filed Mar. 25, 2016, entitled "Content-Aware Compression of Data Using Multiple Parallel Prediction Functions;" U.S. patent application Ser. No. 15/189,318, filed Jun. 22, 2016, now U.S. Pat. No. 9,954,550, entitled "Content-Aware Compression of Data Using Window-Based Selection from Multiple Prediction Functions," and U.S. patent application Ser. No. 15/363,328, filed Nov. 29, 2016, entitled "Content-Aware Compression of Data Using Selection From Multiple Weighted Prediction Functions," each incorporated by reference herein.

FIELD

The field relates generally to compression and decompression of signal data, such as seismic data.

BACKGROUND

Data compression techniques are commonly used to achieve a low bit rate in the digital representation of signals for efficient processing, transmission, and storage. The size of seismic datasets, for example, continues to increase due to the need of extracting oil from more complex geologies. This drives demand for better sensor acquisition technologies, higher resolution hydrocarbon models, more iterations of analysis cycles, and increased integration of a broader variety of data types, all of which contribute to generating more and more data. Thus, seismic data compression has become important in geophysical applications, for efficient processing, storage and transmission of seismic data.

A number of techniques have been proposed for efficient lossless compression of seismic data. For example, U.S. patent application Ser. No. 14/579,130, filed Dec. 22, 2014, now U.S. Pat. No. 9,660,666, entitled "Content-Aware Lossless Compression and Decompression of Floating Point Data," for example, discloses techniques for content-aware lossless compression and decompression of floating point data, such as seismic data, and other data. The disclosed content-aware lossless compression algorithms employ observed phenomena in the data to obtain improved compression ratios and processing speeds, relative to conventional techniques.

Nonetheless, a need remains for improved compression and decompression techniques.

SUMMARY

In one embodiment, a method for compressing at least one floating point number comprises obtaining the at least one floating point number comprising a sign, an exponent at a given base and a significand; applying a default prediction algorithm and at least one other distinct prediction algorithm to the obtained at least one floating point number to generate a plurality of predictions; determining a residual for each of the plurality of predictions based on a difference between the plurality of predictions and the at least one floating point number; determining a bit savings estimate for each of the plurality of predictions based on a difference between an exponent of each the plurality of predictions and an exponent of the residual for each of the plurality of predictions; selecting a given one of the default prediction algorithm and the at least one other distinct prediction algorithm for encoding the at least one floating point number based on the determined bit savings estimate for each of the plurality of predictions; and encoding the at least one floating point number by encoding one or more of the determined residual associated with the selected prediction algorithm and the determined bit savings estimate associated with the selected prediction algorithm. The exponent of the determined residual associated with the selected prediction algorithm is optionally replaced with the determined bit savings estimate associated with the selected prediction algorithm.

In some embodiments, an index of the at least one other distinct prediction algorithm is encoded when the at least one other distinct prediction algorithm is the selected prediction algorithm. For example, the index may comprise a disambiguation index indicating one selected prediction algorithm from a potential subset of prediction algorithms. The potential subset is optionally generated by discarding the predictions that, when added to the determined residual, correspond to a floating point number for which there would be a better prediction resulting in another residual that can be represented with fewer bits.

In one illustrative embodiment, a given one of the at least one other distinct prediction algorithm is selected based on whether the determined bit savings estimate for the given one of the at least one other distinct prediction algorithm is greater than a first threshold. In addition, a given one of the at least one other distinct prediction algorithm is optionally selected based on whether a relative bit savings estimate for the given one of the at least one other distinct prediction algorithm with respect to the default prediction algorithm is greater than a second threshold.

In one or more embodiments, the encoded at least one floating point number is decompressed by decoding the determined residual and the determined bit savings estimate associated with the selected prediction algorithm to determine whether the selected prediction algorithm was the default prediction algorithm or the at least one other distinct prediction algorithm. An index of the at least one other distinct prediction algorithm is read when the selected prediction algorithm was the at least one other distinct prediction algorithm based on whether the decoded determined bit savings estimate for a given one of the at least one other distinct prediction algorithm is greater than a first threshold and on whether a relative bit savings estimate for the given one of the at least one other distinct prediction algorithm with respect to the default prediction algorithm is greater than a second threshold. The exponent of the determined residual is optionally restored by adding the decoded bit savings and the exponent of the selected prediction.

In some embodiments, a set of one or more prediction algorithms is determined out of a larger set of prediction algorithms for a specific data set including the at least one floating point number based on an analysis of the specific data set. One or more of the (i) default prediction algorithms; (ii) the at least one other distinct prediction algorithm; (iii) a first threshold value for the determined bit savings estimate for the at least one other distinct prediction algorithm; and (iv) a second threshold value for a relative bit savings estimate for the at least one other distinct prediction algorithm with respect to the default prediction algorithm are optionally selected for a segment of the specific data set.

Other illustrative embodiments include, without limitation, apparatus, systems, methods and computer program products comprising processor-readable storage media.

BRIEF DESCRIPTION OF THE DRAWINGS

FIG. 3 illustrates an exemplary compression of a sample, $s_i$, using the exemplary minimal-length compression method of FIG. 2, according to one embodiment of the disclosure;

DETAILED DESCRIPTION

Figure 1:
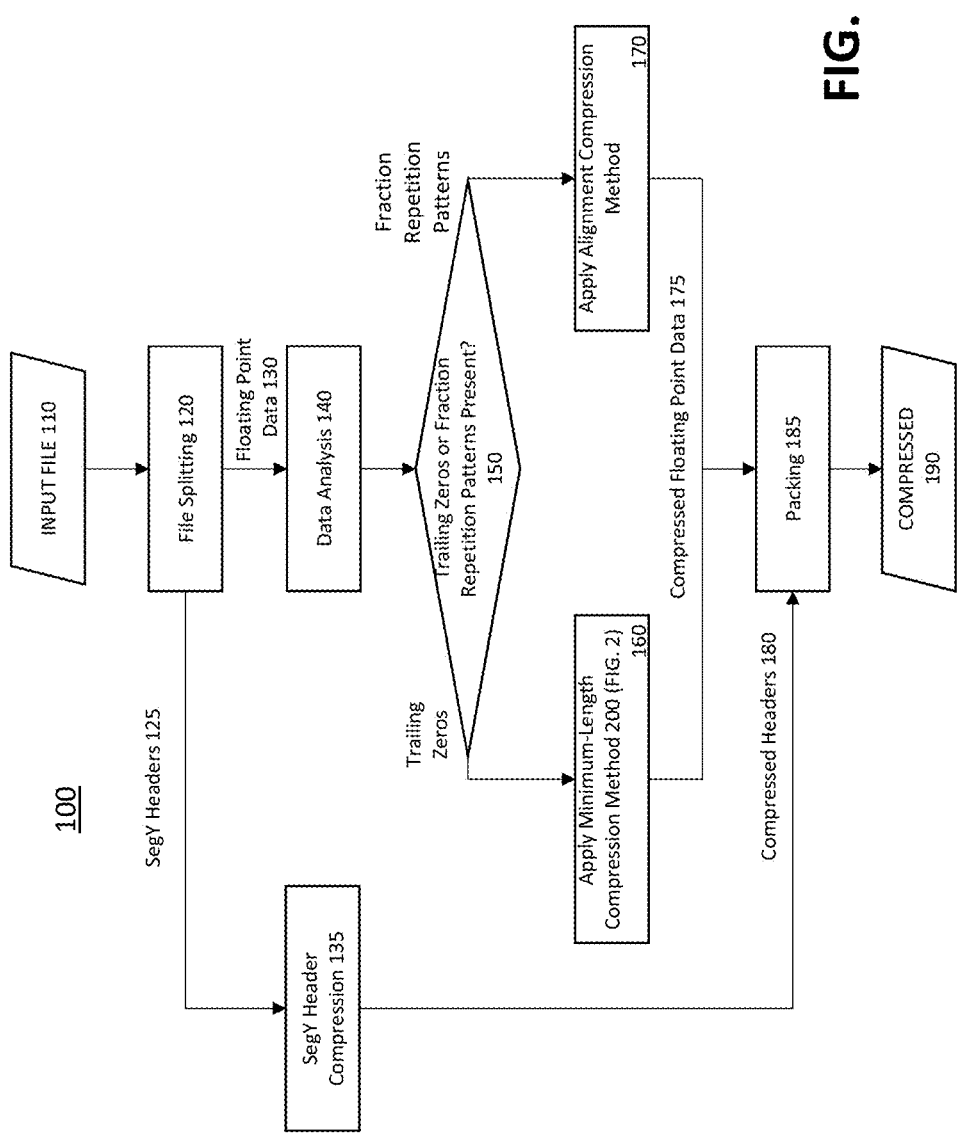
FIG. 1 is a flow chart illustrating an exemplary data compression process, in accordance with an embodiment of the disclosure.

Illustrative embodiments of the present disclosure will be described herein with reference to exemplary communication, storage and processing devices. It is to be appreciated, however, that the disclosure is not restricted to use with the particular illustrative configurations shown. Aspects of the disclosure provide methods and apparatus for compression of floating-point time series using multiple predictors. While the exemplary embodiments are described herein using seismic data, aspects of the present disclosure can be applied to other forms of data, as would be apparent to a person of ordinary skill in the art based on the present disclosure. For example, the disclosed methods can be applied to compress any kind of time series data, such as audio, telemetry and many other sensor-generated datasets that will be increasingly collected due to the Internet of Things.

In one or more embodiments of the disclosure, improved compression ratios are achieved in the lossless compression of seismic, floating-point data, using prediction mechanisms. Such mechanisms interpret the floating-point numbers in seismic data as time series and employ methods to predict the value of a series' sample based on the values of past samples. In the end, the residual (or error) of the prediction is compressed, instead of the original time series value. The general intuition is that a good predictor yields small errors, which in turn require fewer bits to be represented, reducing the overall entropy of the data to be compressed.

One difficulty in using multiple predictors and choosing the best of them per sample lies in how to log information about such best predictor on a sample-by-sample basis. A naïve approach would spend $\lceil \log_2 N \rceil$ bits to choose between N predictors, rendering the combination of predictors ineffective. Data segmentation and a disambiguation criterion can optionally be employed to reduce the amount of bookkeeping per sample, with promising results.

In at least one exemplary embodiment of the present disclosure, the disclosed content-aware compression techniques are based on exemplary data compression algorithms, referred to herein as content-aware lossless compression algorithms, introduced in U.S. patent application Ser. No. 14/579,130, filed Dec. 22, 2014, now U.S. Pat. No. 9,660,666, entitled "Content-Aware Lossless Compression and Decompression of Floating Point Data," incorporated by reference herein. The exemplary content-aware lossless compression algorithms provide a data oriented method for substantially lossless compression of floating point data, such as seismic data, and other data that employs observed phenomena in the data to obtain high compression ratios with fast algorithms. These data compression algorithms are modified as described herein to provide content-aware compression using selection from multiple prediction functions based on estimated bit savings.

The exemplary content-aware lossless compression algorithms comprise a minimal-length compression technique, discussed further below in conjunction with FIG. 2. The minimal-length compression technique classifies the samples so that codes describing both the exponent and the length of the significand can be used to keep only the necessary bits to represent each sample. The disclosed content-aware lossless compression algorithms are optionally combined with prediction models that aim at reducing the entropy of the data. A data analysis step is employed to decide which content-aware lossless compression algorithm is the best for each input dataset, as discussed further below in conjunction with FIG. 1. The minimal-length compression technique further provides versions for fast compression and decompression (Turbo Version) or for substantially maximum compression (Max Version).

One or more embodiments of the disclosure provide improved and efficient content-aware compression and decompression of floating point data (e.g., seismic data) using multiple predictors in parallel and to choose the best predictor for each sample, with reduced (e.g., substantially minimal) bookkeeping. Instead of always resorting to the prediction that is closer to the original value, one or more embodiments of the present disclosure establish a threshold to estimated bit savings so that a default predictor is used whenever it is not worthwhile to store bookkeeping bits that distinguish the predictor that is used.

While the exemplary embodiments employ the content-aware lossless compression algorithms as the compression algorithm, alternate compression algorithms, such as Huffman coding and Lempel-Ziv coding, or variations thereof, can be employed, as would be apparent to a person of ordinary skill in the art.

Content-Aware Lossless Compression Algorithms

FIG. 1 is a flow chart illustrating an exemplary implementation of a data compression process 100. The exemplary data compression process 100 processes seismic data stored in SegY files. Compression of other kinds of floating point data can be adapted from the exemplary embodiment, as would be apparent to a person of ordinary skill in the art. Overall, an input file 110 is split into SegY headers 125 and floating point data values 130 at a file splitting stage 120. The SegY headers 125 are compressed during step 135, for example, with standard entropy encoders or with content-aware compression techniques, such as the techniques disclosed in U.S. patent application Ser. No. 14/867,329, filed Sep. 28, 2015, entitled "Distributed Content-Aware Compression and Decompression of Data."

The floating point data values 130 are processed during step 140 to determine which compression technique 200 is the best for the input file 110, and will follow one of two possible workflows. The data analysis 140 can be carried out on random, small subsets of the input file 110. Statistics on the length of significands of floating point data and on repetition patterns are obtained and ranked. By dividing the input file 110 into chunks, the choice of the compression workflow can optionally be optimized on a chunk-by-chunk basis, enabling the compression of several chunks to be executed in parallel, to substantially maximize performance.

A test is performed during step 150 to determine if trailing zeros or fraction repetition patterns are present in the input file 110. If it is determined during step 150 that trailing zeros are present, then program control proceeds to step 160 for compression using the minimal-length compression method 200 (FIG. 2) to process floating point data that can be trimmed. If, however, it is determined during step 150 that fraction repetition patterns are present, then program control proceeds to step 170 for compression using an exemplary alignment compression method. As discussed further below in conjunction with FIG. 2, the minimal-length compression method 200 can optionally be tuned for turbo or maximum compression.

Finally, compressed floating point data values 175 and compressed headers 180 are applied to a packing module during step 185, which organizes the compressed floating point data values 175 and compressed headers 180 in one or more compressed files 190 for access by a decompressor.

The algorithms for decompressing the compressed data are straightforward to a person of ordinary skill in the art, based on the discussion of the compression algorithms provided herein. The execution times of the decompression algorithms vary between 50% and 100% of the compression times. Thus, the remaining discussion focuses primarily on the description of the compression algorithms.

Min-Length Compression

Generally, as noted above, the minimal-length compression method 200 achieves fast compression through the efficient removal of trailing zeros from the least significant part of the significand of floating-point seismic samples. The algorithm exploits correlations between the exponents and the length of the significands of samples, which is the number of bits from the highest bit of the significand to the least significant bit 1 that precedes the trailing sequence of zeros. A cumulative histogram of classes represented by {exponent, length} classes is built and used to select those classes that will give the best compromise between bookkeeping and bit savings. Classes that are not initially part of the selected best classes are grouped and compete with the selected classes so that the best combination of individual classes and groups is obtained. The compression is performed in two steps through the data. In the first, the statistics about the samples are gathered, and the classes and groups are formed and selected. In the second step, the samples are classified and encoded according to the classes' specifications.

As discussed hereinafter, the exemplary minimal-length compression method 200 depends on a user-defined parameter, $N>0$, which is a superior limit for the number of output {exponent, length} classes. For each input sample, the method 200 writes to the compressed stream 1 bit to represent the sign of the sample, $\lceil \log_2 N \rceil$ bits for the class code associated with the sample, and a certain number of bits for the sample's significand, associated with the length derived from the sample's class.

Figure 2:
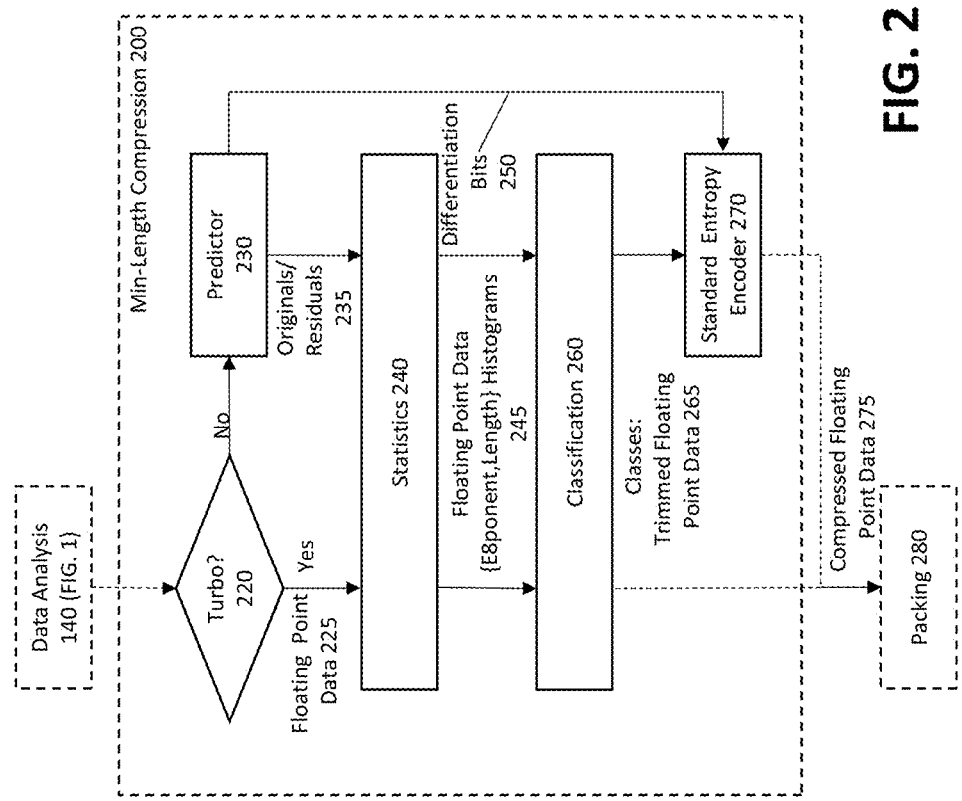
FIG. 2 is a flow chart illustrating an exemplary minimal-length compression method, according to one embodiment of the disclosure.

FIG. 2 is a flow chart illustrating an exemplary implementation of the minimal-length compression method 200. As previously indicated, the exemplary minimal-length compression method 200 compresses the input file 110 by removing unnecessary trailing zeros from significands. If zeros are removed from the original data, this information needs to be stored so that the original number can be rebuilt in the decompression phase, without data loss. Bookkeeping for such information for every sample can be costly and may result in poor compression performance. The exemplary minimal-length compression method 200 balances the removal of zeros and the bookkeeping. As discussed above, the minimal-length compression method 200 can optionally be tuned for turbo or maximal compression.

Thus, a test is performed during step 220 to determine if a turbo compression or a maximal compression will be performed. If it is determined during step 220 that a turbo compression will be performed, then program control proceeds directly to step 240 to process the floating point data 225.

The exemplary minimal-length compression method 200 works in two passes through the data. In the first pass, statistics on the lengths of the significands and their correlation with the corresponding exponents are gathered during step 240. The length of a significand is defined as the number of bits from the bit of highest order to the lowest order bit one preceding the sequence of trailing zeros. Every {exponent, length} pair is defined as a class and the statistics indicate how many bits can be saved if a specific code is created for that class and the trailing zeros of the significand of the samples of that class are removed. The output of the statistics phase 240 is a collection of histograms 245 of {exponent, length} pairs.

Given a (configurable) superior limit, $N>0$, to the number of classes to be represented, the exemplary minimal-length compression method 200 carries out a second pass through the input file 110 during step 260, removing zeros from samples of those classes in the histogram data 245 that will yield the best compression ratios in the trimmed floating point data 265. The referred superior limit N determines how many bits are necessary to store class codes associated with {exponent, length} pairs. The remaining classes are optionally grouped so that the highest number of zeros can be removed with the least amount of bookkeeping.

For classes associated with {exponent, length} pairs, let $B_c = \lceil \log_2 N \rceil$ be the number of bits necessary to store class codes, $B_s = 1$ be the number of bits to store the sign of the floating point number, and $B_l$=length be the number of bits to store its significand. The classification of the samples during step 260 creates six types of classes:

Classes that represent a single exponent and a single length: in this case, for each sample, $[B_s+B_c+(B_l-1)]$ bits are stored, since the least significant bit of the significand is known to be 1 and, as such, does not need to be stored.

Classes that represent, for a single exponent, all lengths equal to or less than the length representative of the class: in this case, $[B_s+B_c+B_l]$ bits are stored for each sample (note that the least significant bit needs to be stored).

Classes that combine consecutive exponents that can be aligned, having a substantially maximum length: in this case, $[B_s+B_c+B_l+1]$ bits are stored. Notice that the most significant bit 1 of the significand, which is hidden in the IEEE 754 format, has to be explicitly represented when numbers having different exponents are mixed, so that the alignment can be reverted upon decompression.

Classes that combine pairs of exponents that have different lengths: in this case, each sample can be represented by one extra bit that distinguishes the case of one exponent from the other and the corresponding length minus one bit, since the least significant bit does not need to be stored. Thus, $[B_s+B_c+B_l]$ bits are stored for each sample of these classes.

Classes that combine exponents that only have associated lengths of zero or one bit: in this case, no bits of the significand are stored, only a code with $B_z=\lceil \log_2 N_z \rceil$ bits (wherein $N_z$ is the total number of zero-length classes), which will enable the reconstruction of the class at the decompression time. Consequently, $[B_s+B_c+B_z]$ bits are stored.

Classes that handle exceptions: the IEEE 754 format specifies special binary codes for numbers that cannot be represented (also known as "not-a-number", or NaN). These are stored as members of the zero-length classes, in their original form (i.e., with 32 bits), with $[B_s+B_c+B_z+32]$ bits in total.

The size of the code is a (configurable) parameter of the minimal-length compression method 200, which may be defined as either 5 or 6 bits, for example.

If it is determined during step 220 that a maximal compression will be performed, then a prediction is performed during step 230, before program control proceeds to step 240 to process the original values and residual values 235. The variation of the minimal-length compression method 200 for maximum compression works in a similar manner as the turbo version described above. The difference is that a linear prediction algorithm is employed during step 230 to predict the value of every data sample based on a sequence of previous samples. A number of exemplary algorithms are available. See, for example, Monson H. Hayes, "9.4: Recursive Least Squares," Statistical Digital Signal Processing and Modeling, p. 541 (Wiley, 1996); G. Mandyam et al., "Lossless Seismic Data Compression Using Adaptive Linear Prediction," in Geoscience and Remote Sensing Symposium (1996); or U.S. patent application Ser. No. 14/230,510, filed Mar. 31, 2014, now U.S. Pat. No. 9,858,311, entitled "Heteroscedastic Data Compression Using Arima-Garch Model Estimation," each incorporated by reference herein.

Generally, a linear prediction algorithm is employed during step 230 in order to use a prediction error, or residual, as the input for the compression algorithm, instead of the original data. Depending on the quality of the employed predictor, the residual can be very small. Consequently, it would need fewer significant bits to be represented, in comparison with the original data, resulting in more effective compression. Adaptive linear prediction (in which prediction coefficients are updated with the execution of the algorithm) provides a good compromise between prediction power and speed of execution.

In the case of floating point data, the residual could have a longer length, even if its absolute value is lower than that of the original value. To ensure that the residual values demand fewer bits than the original values, the following strategy is adopted in the exemplary embodiment:

During compression, the prediction and the original value are aligned to the same exponent, and the prediction is truncated at the bit that precedes the least significant bit 1 of the original value. By doing this, the least significant bit of the residual will be the least significant bit 1 of the original value when they are aligned. If the absolute value of the residual is lower than that of the original value, its length is equal to or shorter than that of the original value when the exponents are restored.

During decompression, the residual value is aligned with the prediction (which is the same prediction originated at compression time) and the prediction is truncated at the bit that precedes the least significant bit 1 of the residual. The residual is then added to the prediction in order to exactly obtain the original value.

On average, it has been observed that residuals are indeed "shorter" than the original data samples. In order to improve the compression ratios even further, the residual is replaced with the original sample whenever the former needs, in reality, more bits to be represented. In one or more embodiments, only one bit of bookkeeping, referred to in FIG. 2 as a differentiation bit 250, is necessary to differentiate between the two types, therefore with minimal impact. As the frequency in which residuals are longer than the original values is low, the compression of this optional differentiation bit 250 is very high, so that this differentiation tends to increase compression ratio.

In the maximum compression mode, the class codes and trimmed floating point data 265 generated by the classification 260 and the differentiation bits 250 are further processed using an entropy encoder 270, in a known manner.

Thus, during a maximal compression by the exemplary minimal-length compression method 200, a prediction $P(s_i)$ is generated for each sample $s_i$ of the dataset, and the residual $e_i=s_i-P(s_i)$ is calculated. The residual, in turn, is encoded by the exemplary minimal-length compression method 200 and stored in compressed format.

Finally, compressed floating point data values 275 are applied to a packing module during step 280, which organizes the compressed floating point data values 275 in one or more compressed files for access by a decompressor. During decompression, the compressed residual is read and decoded. The prediction $P(s_i)$ generated at the compression phase is generated again, based on past decompressed samples. The original sample is finally obtained without loss as $s_i=e_i+P(s_i)$.

Improving Compression Ratios Using Multiple Predictors and Estimated Bit Savings As noted above, one or more embodiments of the disclosure achieve improved compression ratios in substantially lossless compression of floating-point data (e.g., seismic data), using multiple prediction mechanisms. Such mechanisms interpret the floating-point numbers in seismic data as time series and employ methods to predict the value of a sample based on the values of past samples. In the end, the residual (or error) of the prediction is compressed, instead of the original time series value. The general intuition is that a good predictor yields small errors, which in turn require fewer bits to be represented, reducing the overall entropy of the data to be compressed.

In one or more embodiments, the efficiency of the minimal-length compression process is improved, relative to the techniques described in U.S. patent application Ser. No. 14/579,130, filed Dec. 22, 2014, now U.S. Pat. No. 9,660,666, entitled "Content-Aware Lossless Compression and Decompression of Floating Point Data," using multiple prediction functions.

In one or more embodiments of the disclosure, the decompressor infers the best predictor used for each sample from information stored in the exponent of the associated compressed residual. In order to reduce the bookkeeping, the best predictor is only used, in one or more exemplary embodiments, when the best predictor largely improves over a "default" predictor for the data set. Such improvement is measured in terms of thresholds of a compression metric used to evaluate how many bits are saved if the residual of any of the predictors in the base predictor set is used in the compression of a particular sample. Such an estimate corresponds to the difference between the exponent of the prediction that was used and the exponent of the corresponding residual. Instead of storing the actual exponent of the residual, this difference is stored and used to infer whether the default predictor was used or not. With the prediction that was used, the actual exponent of the residual can be computed and then used to rebuild the sample.

Binary Representation of Floating-Point Numbers

The IEEE 754 format for floating-point representation and arithmetic is the floating-point format of modern day computing. See, e.g., IEEE, "754-2008—IEEE Standard for Floating-Point Arithmetic," IEEE, 2008, incorporated by reference herein in its entirety.

One or more embodiments of the disclosure are mostly interested in the single-precision variation, with 32 bits, but the ideas apply to double precision (64 bits) as well, as would be apparent to a person of ordinary skill in the art.

Going from the highest order bit to the lowest order bit, the single-precision floating-point representation reserves one bit to indicate the sign of the number, 8 bits to indicate the exponent and 23 bits to indicate the normalized significand, such that a real number R is calculated in exponential notation as:

$$R=(-1)^{sign} \times 1.\text{significand} \times 2^{exponent}.$$

Note that, according to the representation, the bit 1 before the radix point of the normalized significand always has a binary value of 1, and therefore does not need to be stored (often referred to as a hidden bit).

With such a representation, some arithmetic operations might result in "denormalized" floating-point numbers. A normalization process is therefore carried out by the floating-point arithmetic unit (FPU) of the computer, meaning that the significand is shifted to the left or to the right until the number is normalized. Consequently, the resulting exponent is reduced or increased by the number of bit shifts to the left or right, respectively. For example:

$$R = (-1)^{sign} \times 0.00000101100111010010000 \times 2^{exponent}$$
$$= (-1)^{sign} \times 1.01100111010010000000000 \times 2^{(exponent-6)},$$

where the value (exponent−6) indicates that the significand is shifted 6 shifts to the left.

Prediction Mechanism Leads to Bit Savings

The normalization process described above is intimately related to the number of bits that can be saved in the compression process when prediction is employed. Generally, the exemplary minimal-length compression method 200 leverages the existence of sequences of trailing zeros present in the low-order end of the significand of floating-point numbers. When the residual of the prediction of a sample is computed as $e_i=s_i-P(s_i)$, it is very likely that the binary representation of $e_i$ will have many zeros in the higher order part of its significand, if the predicted value is close enough to the sample value. When the residual is normalized, those zeros will appear as trailing zeros in the significand of $e_i$. It is expected that the sequence of trailing zeros in $e_i$ will be much longer than the one that appears originally in $s_i$, resulting in the intended bit savings in the compression. Note that, in U.S. patent application Ser. No. 14/579,130, filed Dec. 22, 2014, now U.S. Pat. No. 9,660,666, a truncation mechanism was disclosed to substantially guarantee that the estimated bit savings are actually obtained. In one or more embodiments, this truncation is necessary because a floating-point number of small magnitude ($e_i$, in this case) can have more bits in its significand than a number of higher magnitude ($s_i$, in this case). For example, in decimal representation, 0.1233456789 is smaller than 1, but the former requires many more digits to be presented.

FIG. 3 illustrates an exemplary compression of a sample, $s_i$, using the exemplary minimal-length compression method 200, according to one embodiment of the disclosure. As noted above, during a maximal compression by the exemplary minimal-length compression method 200, a prediction $P(s_i)$ is generated for the sample $s_i$, during step 310. The truncation mechanism is then applied to the prediction $P(s_i)$ during step 320 relative to the least significant bit 1 (LSB) of the significand of the original sample to ensure that the estimated bit savings are obtained. The residual $e_i=s_i-P'(s_i)$ is calculated during step 330. The residual, in turn, is normalized during step 340 (moving upper zeroes from left of LSB to right of LSB) and then encoded by the exemplary minimal-length compression method 200 and stored in compressed format.

As shown in FIG. 3, the bit savings shown in step 340 is a savings of seven (7) additional bits, relative to the original sample, $s_i$.

Compression Metric Based on Differences Between Exponents

From the example of FIG. 3, it can be seen that the number of bits saved with the residual is directly related to the number of bit shifts necessary to normalize the residual. As indicated above, this number of bit shifts is expressed in the difference between the exponent of the denormalized number and the final exponent, after the number is normalized. When performing a subtraction of floating-point numbers in binary representation, the minuend and the subtrahend must first be "aligned" to the same exponent, via bit shifts (an operation carried out internally by the FPU). Once the truncated subtraction is executed as explained above, the residual of the prediction will directly reflect the bit savings obtained with the prediction. The bit savings, $G_{ij}$, obtained when using a certain predictor $P_j(s_i)$ can be expressed as follows:

$$G_{ij} = \begin{cases} \text{exponents}(s_i) - \text{exponent}(e_{ij}), & |e_{ij}| < |s_i| \\ 0, & \text{otherwise} \end{cases}.$$

The relationship between exponents and bit savings is used in one or more embodiments to leverage the potential gains in bit savings obtained when multiple predictors are used in parallel for the compression of time series data.

Select Best Predictor Per-Sample Using Bit Savings Information

One or more embodiments of the disclosure select the best predictor for each sample using the value stored in the exponent of the residual as an indication of the estimated bit savings associated with a particular prediction. As mentioned above, instead of storing the actual exponent of the residual, one or more embodiments store these estimated bit savings so that they can be used to rebuild the actual exponent and to help infer the prediction that was used in the compression of each sample.

Consider a set of N predictors $P_j(s_i)=RLS_{\lambda_j,\delta_j,p_j}$, $j=1 \ldots N$. This is the set of predictors that, when combined, substantially maximize the gross total bit savings across a statistically significant subsection of the data. In this context, $P_1$ is designated as the "best" individual predictor in the set, and is herein referred to as the default predictor.

For each sample, $s_i$, the bit savings obtained with each predictor $P_{ij}$ is computed, which is given by metric $G_{ij}$ defined above. Note that the predictor that maximizes the value of $G_{ij}$ for each sample can be selected, referred to as the best predictor, $P_b$, and the index of such best predictor can be naïvely encoded using $\lceil \log_2 N \rceil$ bits per sample. However, it has been found that, in general, the default predictor, $P_1$, is the overall best predictor on average, but other predictors might show much better local performance in some parts of the data. Additionally, $P_1$ tends to be almost as good as $P_b(s_i)$ for a large number of samples.

As a result, one or more exemplary embodiments process the encoded exponent of the residual to detect if it is better to use $P_1$ $(s_i)$ directly or to encode $P_b(s_i)$. By doing this, bookkeeping information about the best predictor is only needed when the bit savings associated with it pay off. In other words, the bit savings should be more than the $\lceil \log_2 N \rceil$ bits necessary to encode $P_b(s_i)$ for a given sample.

Figure 4:
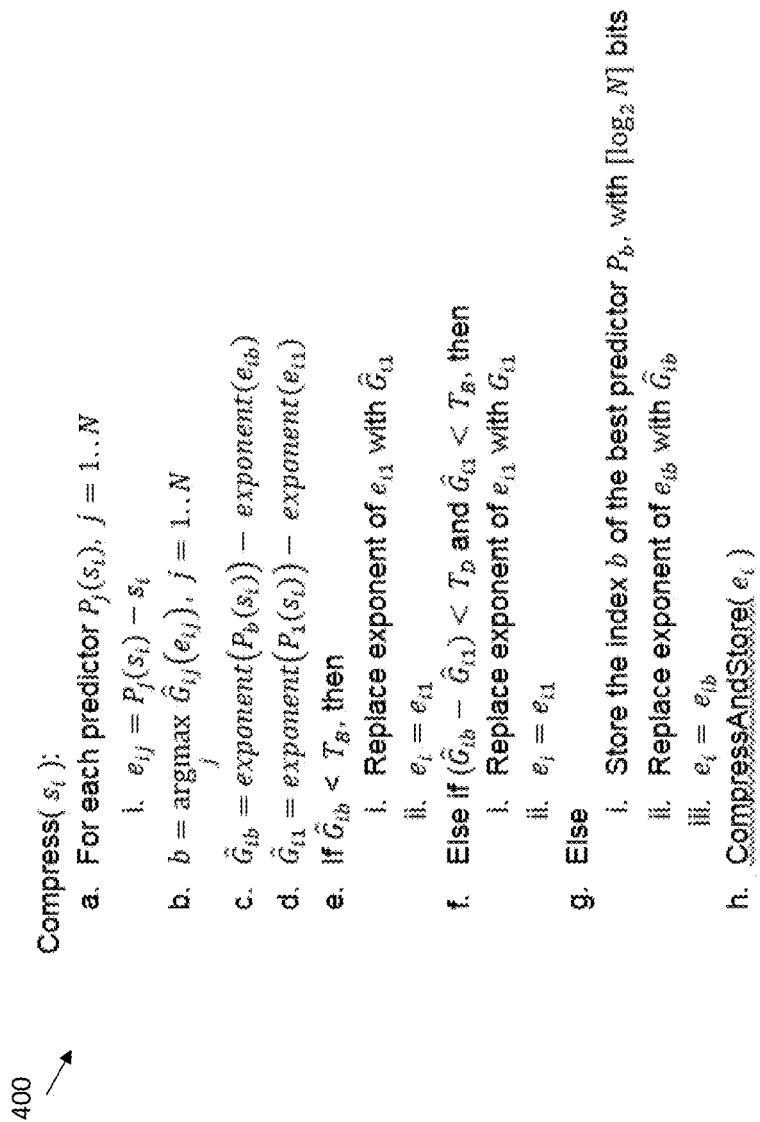
FIGS. 4 and 5, respectively, illustrate exemplary pseudo code of an exemplary minimal-length compression method and decompression method using estimated bit-saving thresholds and multiple predictor functions, according to various embodiments of the disclosure.

FIG. 4 illustrates exemplary pseudo code of an exemplary minimal-length compression method 400 using estimated bit-saving thresholds, according to one embodiment of the disclosure. It has been observed that the exponents of the predictions are almost always equal to the exponents of the samples. In this way, the exponent of the residual can be encoded indirectly as the difference between the exponent of the chosen predictor and the exponent of the residual. This difference is used as an estimate, $\hat{G}_{ij}$, of the true bit savings.

As shown in FIG. 4, the residual is computed for a given sample $s_i$ using each of the multiple predictors during step a.i. The variable b is used as the index for the best prediction for the sample. The substantially maximum estimate, $\hat{G}_{ij}$, of the true bit savings is defined during step b.

The estimate, $\hat{G}_{ib}$, of the true bit savings for the "best" predictor is obtained during step c as the difference between the exponent of the prediction using the "best" predictor and the exponent of the residual using the "best" predictor.

The estimate, $\hat{G}_{i1}$, of the true bit savings for the "default" predictor is obtained during step d as the difference between the exponent of the prediction using the "default" predictor and the exponent of the residual using the "default" predictor.

Generally, if the total bit savings associated with $P_b(s_i)$ is greater than a threshold $T_B$ and if the relative bit savings with respect to the default predictor $P_1(s_i)$ is greater than a threshold $T_D$, then the exemplary minimal-length compression method 400 spends $\lceil \log_2 N \rceil$ to indicate that $P_b(s_i)$ is the predictor used for sample $s_i$. Otherwise, $P_1$ $(s_i)$ is used without any bookkeeping. Note that, during the decompression, the values of the predictors and the residual are available but the value of the sample is still to be computed. In this way, it cannot be assumed that the exponent of the sample will be known.

Thus, if the total bit savings, $\hat{G}_{ib}$, associated with $P_b(s_i)$ is not greater than the threshold $T_B$, then the exponent of the residual using the "default" predictor is replaced with the estimate, $\hat{G}_{i1}$, of the true bit savings for the "default" predictor; and the residual for the sample is set to the residual from the "default" predictor during step e. Generally, step e checks whether the bit savings of the selected best predictor are above the "global" threshold, $T_B$. If the bit savings are not above the "global" threshold, $T_B$, the $P_1$ $(s_i)$ is used directly, without bookkeeping.

If the relative bit savings $(\hat{G}_{ib}-\hat{G}_{i1})$ with respect to the default predictor $P_1$ $(s_i)$ is less than the threshold $T_D$, and the total bit savings, $\hat{G}_{i1}$, for the "default" predictor is less than the threshold $T_B$, then the default predictor $P_1$ $(s_i)$ is used as the chosen predictor, without any bookkeeping (step f).

Namely, the exponent of the residual using the "default" predictor is replaced with the estimate, $\hat{G}_{i1}$, of the true bit savings for the "default" predictor; and the residual for the sample is set to the residual from the "default" predictor during step f.

If, however, the total bit savings, $\hat{G}_{ib}$, associated with $P_b(s_i)$ is greater than the threshold $T_B$ and if the relative bit savings $(\hat{G}_{ib}-\hat{G}_{i1})$ with respect to the default predictor $P_1$ $(s_i)$ is greater than the threshold $T_D$, then the exemplary minimal-length compression method 400 spends $\lceil \log_2 N \rceil$ to indicate that $P_b(s_i)$ is the predictor used for sample $s_i$ (step g). In particular, the index b of the best predictor, $P_b$, is stored with $\lceil \log_2 N \rceil$ bits; the exponent of $e_{ib}$ is replaced with $\hat{G}_{ib}$; and $e_i = e_{ib}$, during step g.

Note that checking $T_D$ is necessary, in one or more embodiments, in order not to waste bookkeeping bits in situations where $P_b(s_i)$ does not sufficiently improve over the default predictor, $P_1$ $(s_i)$. A side effect of this approach is that if $P_b(s_i)=P_1(s_i)$ and $G_{i1}>T_B$, the exemplary minimal-length compression method 400 will bookkeep information about $P_1$, which is not necessary in the general case. Such bookkeeping will in general pay off because the associated bit savings will be larger than the pre-defined threshold. Finally, the values of $T_B$ and $T_D$ are data-dependent, and have to be globally optimized for the dataset. The values of $T_B$ and $T_D$ need to be sent as side information, but the overhead is negligible when compared to the size of the dataset.

Figure 5:
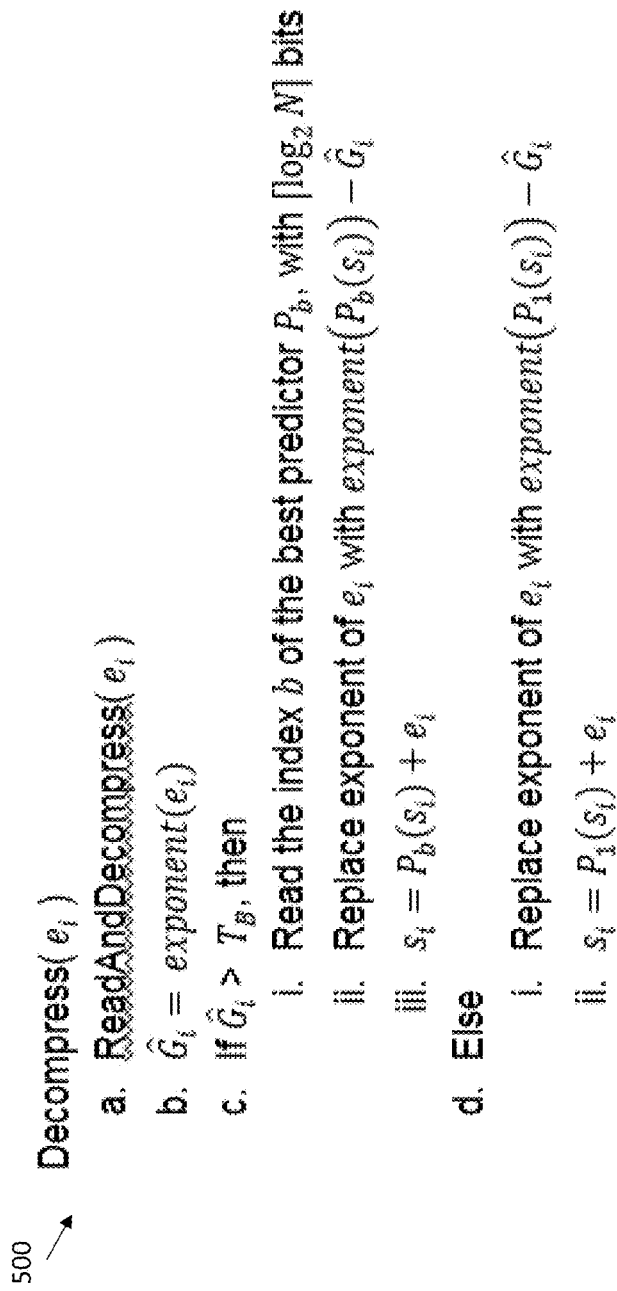

FIG. 5 illustrates exemplary pseudo code of an exemplary minimal-length decompression method 500 using estimated bit-saving thresholds, according to one embodiment of the disclosure. Generally, the decompression process 500 decompresses the compressed data in a straightforward manner, based on the discussion of the compression process 400 provided above.

As shown in FIG. 5, the residual is read and decompressed during step a. The bit savings estimate, $\hat{G}_i$, is set to the exponent of the residual of the sample during step b. If it is determined during step c that the bit savings estimate, $\hat{G}_i$, is greater than the threshold $T_B$, then the exemplary minimal-length decompression method 500 reads the index b of the best predictor $P_b$, with $\lceil \log_2 N \rceil$ bits; replaces the exponent of $e_i$ with exponent$(P_b(s_i))-\hat{G}_i$ and sets $s_i=P_b(s_i)$ $e_i$.

If it is determined during step c that the bit savings estimate, $\hat{G}_i$, is not greater than the threshold $T_B$, then the exponent of $e_i$ is replaced with exponent$(P_1(s_i))-\hat{G}_i$ and $s_i=P_1(s_i)+e_i$ during step d.

Thus, the exemplary minimal-length decompression method 500 recreates the decision process in the decoder by evaluating the exponent of the residual, the values of the predictors, and $T_B$.

Overall, it has been found that the disclosed compression techniques using selection from multiple prediction functions based on estimated bit savings obtain good compression ratios with this method alone. Still, to increase the ratios, the disclosed method can be combined with the ones presented in U.S. patent application Ser. No. 15/080,751, referenced above.

Combining with Other Strategies

It has been found that substantial gains in compression ratios are obtained when the exemplary minimal-length compression method 400 using estimated bit-saving thresholds is combined with the data segmentation and disambiguation techniques presented, for example, in U.S. patent application Ser. No. 15/080,751.

The samples are segmented using one of two possible strategies. The first strategy takes regular, contiguous blocks of samples. The second strategy uses the technique in U.S.

patent application Ser. No. 15/080,751, where the segments represent ranges of local data variance, into which samples are classified. It has been found that the first strategy tended to work better for the data sets used in the experiments.

When breaking the data into regular blocks, the best size of the block must be chosen. In a number of simulations, block sizes ranging from 64 to 208 samples were tested.

Next, for each block, the best predictors and the best values of $T_B$ and $T_D$ are selected. To select the best predictors of each block, a pool of 32 good predictors is initially used, chosen with a greed algorithm described in U.S. patent application Ser. No. 15/080,751. From this pool of predictors, a subset of N=4 predictors is selected for the block and also good values of $T_B$ and $T_D$.

To select the best subset of N=4, and the best values of $T_B$ and $T_D$ one can use an exhaustive approach, and test all possible combinations. However, this is very computing intensive. In order to increase the speed, a substantially exhaustive search is run to find the best values of $T_B$ and $T_D$, and then perform a greedy approach to select the best subset of N=4. Thus, for each fixed value of $T_B \in [1, 2, \ldots, 20]$ and $T_D \in [0, 1, 2, \ldots, 6]$, the best predictor, on average, is chosen out of the 32 available, which is selected as the default predictor, $P_1$. To select the second predictor, $P_1$ is tested combined with the other 31 available, and $P_2$ is chosen. To get $P_3$, the combination of $P_1$, $P_2$ is tested with the other 30 available predictors and repeat the processes to get $P_4$. Note that for each pair $T_B$, $T_D$ there will be four predictors. In the end, the pair $T_B$, $T_D$ chosen is the one that yielded the highest bit savings.

In this way, the values of $T_B$, $T_D$ have to be encoded, as well as the predictors used for each block. Following the exemplary minimal-length compression method 400 of FIG. 4, $\log_2 4 = 2$ bits are used to inform the decompressor of the best predictor used for each sample in the block, whenever such best predictor yields bit savings larger than the selected thresholds.

In order to maximize gains, in one or more embodiments, the global optimization process includes the disambiguation criterion presented in U.S. patent application Ser. No. 15/080,751, which helps the decompressor infer from the value of residual the predictor used for a particular sample. By doing this, only information about the predictors that could potentially have generated that residual is used as bookkeeping. Instead of always spending $\log_2 4 = 2$ bits (for N=4 predictors), there are a large number of samples for which fewer than 4 predictors are the candidates for the best predictor. Consequently, the bookkeeping associated with the disambiguation is reduced. In cases where only 1 predictor could possibly have generated the encoded residual, no bookkeeping is necessary.

Examples

It has been found that the results obtained with the disclosed methods vary according to the complexity of the data sets.

In U.S. patent application Ser. No. 14/579,130, now U.S. Pat. No. 9,660,666, the parameters of the RLS predictor were fixed for all data sets and chosen after running several experiments on different data. This predictor is referred to as the "baseline predictor," $P_{Base}$, whose parameters are:
  forgetting factor $\lambda = 0.99$;
  predictor length p=8; and
  $\delta = 1$.

Considering the disclosed exemplary minimal-length compression method 400 of FIG. 4 using multiple predictors with estimated bit-saving thresholds, the following configuration was chosen:
  N=32 predictors;
  B$\in \{64, 80, 96, 112, 128, 144, 160, 176, 192, 208\}$ as the block sizes; and
  $N_B$=4 as the number of active predictors in each block.

For the N=32 predictors used in the experiments, the gross bit savings per sample when choosing the best predictor for each sample was, on average, 11.94. When considering the naïve approach of bookkeeping $\lceil \log_2 N \rceil = 5$ bits to indicate the best predictor per sample, the net savings dropped to 6.94, rendering the naïve approach ineffective, since the use of $P_{Base}$ alone yields average bit savings of 7.69. The disclosed method effectively reduces the amount of bookkeeping and increases the average bit savings to 9.46 (with B=208 and $N_B$=4), which improves $P_{Base}$ by approximately 23%.

CONCLUSION

One or more embodiments of the disclosure provide methods and apparatus for content-aware compression of data using selection from multiple prediction functions based on estimated bit savings. In one or more embodiments, a data compression method is provided that improves compression ratios while reducing bookkeeping derived from the use of multiple predictors in the compression of time series data composed of floating-point samples. One goal is to compress the residual, or error, of the substantially best prediction for each time series sample, instead of the sample value itself. Based on techniques disclosed in U.S. patent application Ser. No. 14/579,130, now U.S. Pat. No. 9,660,666, the predictor selected for each time series is encoded using information related to the difference between the exponents of predictions and their corresponding residuals. Such an encoding enables the reduction of bookkeeping related to the specification of which predictor was used. Generally, bit savings are estimated based on this difference and a predictor different from a default predictor is only used if the estimated bit savings are larger than a predefined threshold.

The foregoing applications and associated embodiments should be considered as illustrative only, and numerous other embodiments can be configured using the techniques disclosed herein, in a wide variety of different applications.

It should also be understood that the disclosed techniques for content-aware compression of data using selection from multiple prediction functions based on estimated bit savings, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed techniques for content-aware compression of data using selection from multiple prediction functions based on estimated bit savings may be implemented using one or more processing platforms. One or more of the processing modules or other components may therefore each run on a computer, storage device or other processing platform element. A given such element may be viewed as an example of what is more generally referred to herein as a "processing device."

As noted above, illustrative embodiments disclosed herein can provide a number of significant advantages relative to conventional arrangements. It is to be appreciated that the particular advantages described above and elsewhere herein are associated with particular illustrative embodiments and need not be present in other embodiments. Also, the particular types of information processing system features and functionality as illustrated and described herein are exemplary only, and numerous other arrangements may be used in other embodiments.

In these and other embodiments, compute services can be offered to cloud infrastructure tenants or other system users as a PaaS offering, although numerous alternative arrangements are possible.

Some illustrative embodiments of a processing platform that may be used to implement at least a portion of an information processing system comprises cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components such as a content-aware compression device and/or a content-aware decompression device, or portions thereof, are illustratively implemented for use by tenants of such a multi-tenant environment.

Cloud infrastructure as disclosed herein can include cloud-based systems such as AWS, GCP and Microsoft Azure™. Virtual machines provided in such systems can be used to implement at least portions of one or more of a content-aware compression platform and/or a content-aware decompression platform in illustrative embodiments. The cloud-based systems can include object stores such as Amazon™ S3, GCP Cloud Storage, and Microsoft Azure™ Blob Storage.

In some embodiments, the cloud infrastructure additionally or alternatively comprises a plurality of containers implemented using container host devices. For example, a given container of cloud infrastructure illustratively comprises a Docker container or other type of LXC. The containers may run on virtual machines in a multi-tenant environment, although other arrangements are possible. The containers may be utilized to implement a variety of different types of functionality within the content-aware compression and decompression devices. For example, containers can be used to implement respective processing devices providing compute services of a cloud-based system. Again, containers may be used in combination with other virtualization infrastructure such as virtual machines implemented using a hypervisor.

Illustrative embodiments of processing platforms will now be described in greater detail with reference to FIGS. 6 and 7. These platforms may also be used to implement at least portions of other information processing systems in other embodiments.

Figure 6:
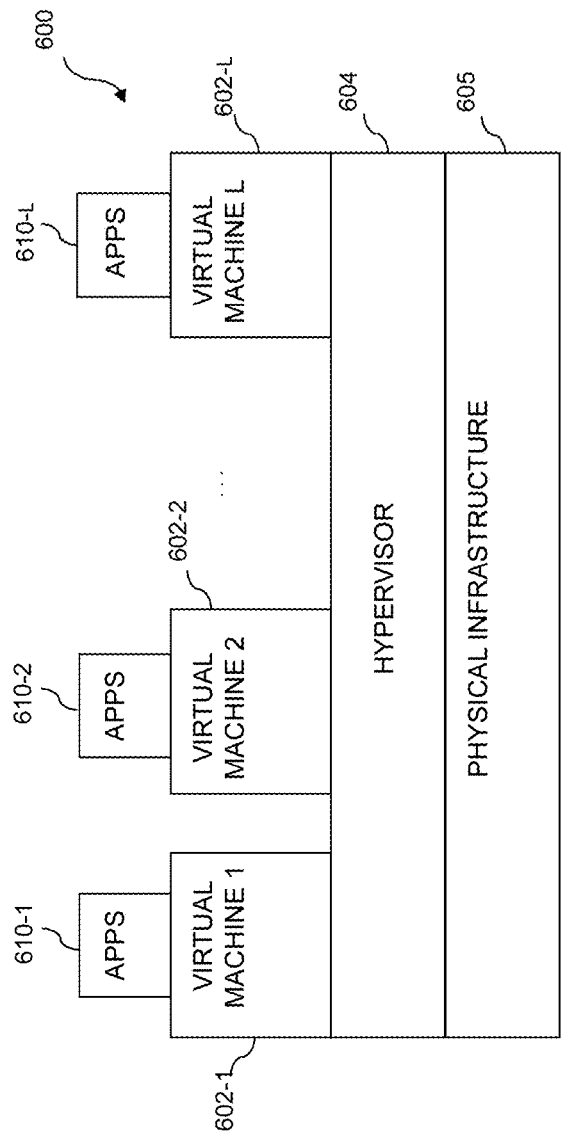
FIG. 6 illustrates an exemplary processing platform that may be used to implement at least a portion of one or more embodiments of the disclosure comprising a cloud infrastructure.

Referring now to FIG. 6, one possible processing platform that may be used to implement at least a portion of one or more embodiments of the disclosure comprises cloud infrastructure 600. The cloud infrastructure 600 in this exemplary processing platform comprises virtual machines (VMs) 602-1, 602-2, . . . 602-L implemented using a hypervisor 604. The hypervisor 604 runs on physical infrastructure 605. The cloud infrastructure 600 further comprises sets of applications 610-1, 610-2, . . . 610-L running on respective ones of the virtual machines 602-1, 602-2, . . . 602-L under the control of the hypervisor 604.

The cloud infrastructure 600 may encompass the entire given system or only portions of that given system, such as one or more of client, servers, controllers, or computing devices in the system.

Although only a single hypervisor 604 is shown in the embodiment of FIG. 6, the system may of course include multiple hypervisors each providing a set of virtual machines using at least one underlying physical machine. Different sets of virtual machines provided by one or more hypervisors may be utilized in configuring multiple instances of various components of the system.

An example of a commercially available hypervisor platform that may be used to implement hypervisor 604 and possibly other portions of the system in one or more embodiments of the disclosure is the VMware® vSphere™ which may have an associated virtual infrastructure management system, such as the VMware® vCenter™. As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC of Hopkinton, Mass. The underlying physical machines may comprise one or more distributed processing platforms that include storage products, such as VNX™ and Symmetrix VMAX™, both commercially available from Dell EMC. A variety of other storage products may be utilized to implement at least a portion of the system.

In some embodiments, the cloud infrastructure additionally or alternatively comprises a plurality of containers implemented using container host devices. For example, a given container of cloud infrastructure illustratively comprises a Docker container or other type of LXC. The containers may be associated with respective tenants of a multi-tenant environment of the system, although in other embodiments a given tenant can have multiple containers. The containers may be utilized to implement a variety of different types of functionality within the system. For example, containers can be used to implement respective compute nodes or cloud storage nodes of a cloud computing and storage system. The compute nodes or storage nodes may be associated with respective cloud tenants of a multi-tenant environment of system. Containers may be used in combination with other virtualization infrastructure such as virtual machines implemented using a hypervisor.

As is apparent from the above, one or more of the processing modules or other components of the disclosed content-aware compression and decompression systems may each run on a computer, server, storage device or other processing platform element. A given such element may be viewed as an example of what is more generally referred to herein as a "processing device." The cloud infrastructure 600 shown in FIG. 6 may represent at least a portion of one processing platform.

Figure 7:
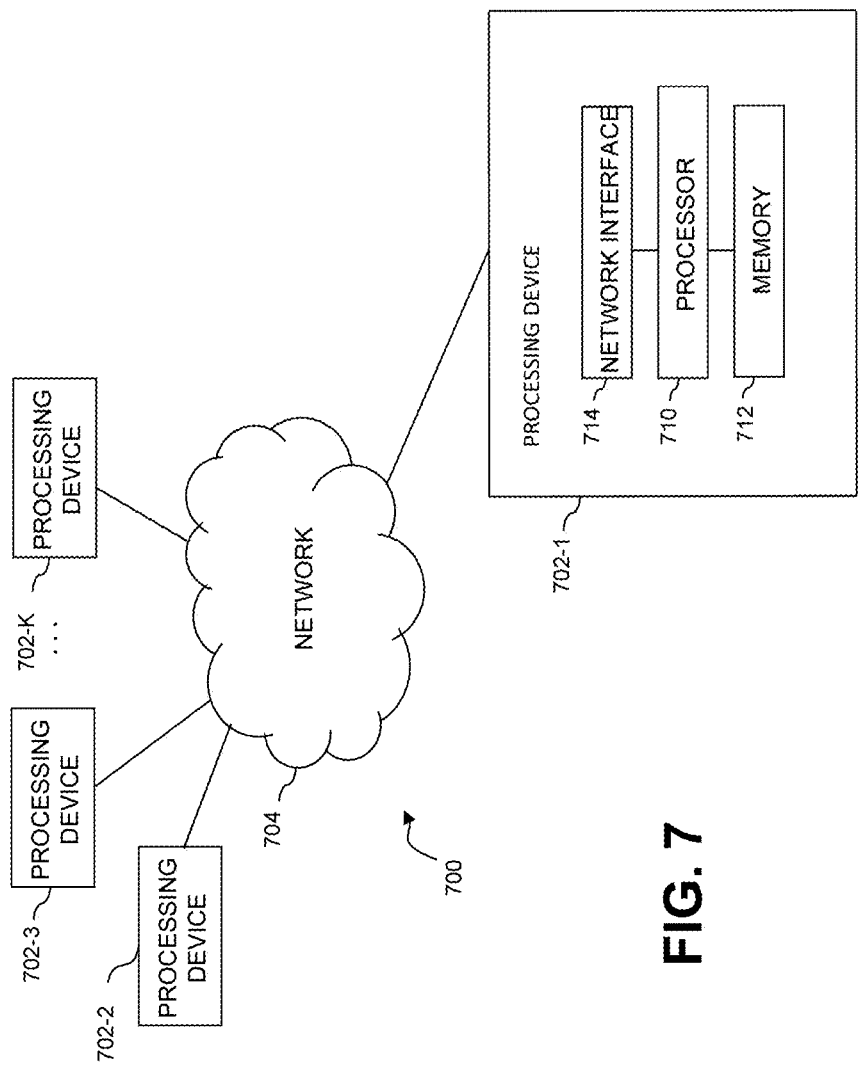
FIG. 7 illustrates another exemplary processing platform that may be used to implement at least a portion of one or more embodiments of the disclosure.

Another example of a processing platform is processing platform 700 shown in FIG. 7. The processing platform 700 in this embodiment comprises at least a portion of the given system and includes a plurality of processing devices, denoted 702-1, 702-2, 702-3, . . . 702-K, which communicate with one another over a network 704. The network 704 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 702-1 in the processing platform 700 comprises a processor 710 coupled to a memory 712. The processor 710 may comprise a microprocessor, a microcontroller, an application specific integrated circuit (ASIC), a field programmable gate array (FPGA) or other type of processing circuitry, as well as portions or combinations of such circuitry elements, and the memory 712, which may be viewed as an example of a "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 702-1 is network interface circuitry 714, which is used to interface the processing device with the network 704 and other system components, and may comprise conventional transceivers.

The other processing devices 702 of the processing platform 700 are assumed to be configured in a manner similar to that shown for processing device 702-1 in the figure.

Again, the particular processing platform 700 shown in the figure is presented by way of example only, and the given system may include additional or alternative processing platforms, as well as numerous distinct processing platforms in any combination, with each such platform comprising one or more computers, storage devices or other processing devices.

Multiple elements of system may be collectively implemented on a common processing platform of the type shown in FIG. 6 or 7, or each such element may be implemented on a separate processing platform.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system. Such components can communicate with other elements of the information processing system over any type of network or other communication media.

As indicated previously, components of an information processing system as disclosed herein can be implemented at least in part in the form of one or more software programs stored in memory and executed by a processor of a processing device. For example, at least portions of the functionality of pseudo code shown in FIGS. 4 and 5 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, compute services platforms, and content-aware compression and/or decompression platforms. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method for compressing at least one floating point number, comprising the steps of:
    obtaining said at least one floating point number comprising a sign, an exponent at a given base and a significand;
    applying a default prediction algorithm and at least one other distinct prediction algorithm to said obtained at least one floating point number to generate a plurality of predictions;
    determining a residual for each of said plurality of predictions based on a difference between said plurality of predictions and said at least one floating point number;
    determining a bit savings estimate for each of said plurality of predictions based on a difference between an exponent of each said plurality of predictions and an exponent of said residual for each of said plurality of predictions;
    selecting, using at least one processing device, a given one of said default prediction algorithm and said at least one other distinct prediction algorithm for encoding said at least one floating point number based on said determined bit savings estimate for each of said plurality of predictions; and
    encoding, using the at least one processing device, said at least one floating point number by encoding one or more of said determined residual associated with said selected prediction algorithm and said determined bit savings estimate associated with said selected prediction algorithm.

2. The method of claim 1, further comprising the step of encoding an index of said at least one other distinct prediction algorithm when said at least one other distinct prediction algorithm is said selected prediction algorithm.

3. The method of claim 2, wherein said index comprises a disambiguation index indicating one selected prediction algorithm from a potential subset of prediction algorithms.

4. The method of claim 3, wherein said potential subset is generated by discarding the predictions that, when added to said determined residual, correspond to a floating point number for which there would be a better prediction resulting in another residual that can be represented with fewer bits.

5. The method of claim 1, wherein a given one of said at least one other distinct prediction algorithm is selected based on whether said determined bit savings estimate for said given one of said at least one other distinct prediction algorithm is greater than a first threshold.

6. The method of claim 1, wherein a given one of said at least one other distinct prediction algorithm is selected based on whether a relative bit savings estimate for said given one of said at least one other distinct prediction algorithm with respect to said default prediction algorithm is greater than a second threshold.

7. The method of claim 1, wherein the exponent of said determined residual associated with said selected prediction algorithm is replaced with said determined bit savings estimate associated with said selected prediction algorithm.

8. The method of claim 1, further comprising the step of decompressing said encoded at least one floating point number by decoding said determined residual and said determined bit savings estimate associated with said selected prediction algorithm to determine whether said selected prediction algorithm was said default prediction algorithm or said at least one other distinct prediction algorithm.

9. The method of claim 8, further comprising the step of reading an index of said at least one other distinct prediction algorithm when said selected prediction algorithm was said at least one other distinct prediction algorithm based on whether said decoded determined bit savings estimate for a given one of said at least one other distinct prediction algorithm is greater than a first threshold and on whether a relative bit savings estimate for said given one of said at least one other distinct prediction algorithm with respect to said default prediction algorithm is greater than a second threshold.

10. The method of claim 8, further comprising the step of restoring the exponent of said determined residual by adding said decoded bit savings and the exponent of said selected prediction.

11. The method of claim 1, further comprising the step of determining a set of one or more prediction algorithms out of a larger set of prediction algorithms for a specific data set including said at least one floating point number based on an analysis of said specific data set.

12. The method of claim 11, wherein one or more of said (i) default prediction algorithms; (ii) said at least one other distinct prediction algorithm; (iii) a first threshold value for said determined bit savings estimate for said at least one other distinct prediction algorithm; and (iv) a second threshold value for a relative bit savings estimate for said at least one other distinct prediction algorithm with respect to said default prediction algorithm are selected for a segment of said specific data set.

13. A computer program product for compressing at least one floating point number, comprising a non-transitory machine-readable storage medium having encoded therein executable code of one or more software programs, wherein the one or more software programs when executed by at least one processing device perform the following steps:

obtaining said at least one floating point number comprising a sign, an exponent at a given base and a significand;

applying a default prediction algorithm and at least one other distinct prediction algorithm to said obtained at least one floating point number to generate a plurality of predictions;

determining a residual for each of said plurality of predictions based on a difference between said plurality of predictions and said at least one floating point number;

determining a bit savings estimate for each of said plurality of predictions based on a difference between an exponent of each said plurality of predictions and an exponent of said residual for each of said plurality of predictions;

selecting a given one of said default prediction algorithm and said at least one other distinct prediction algorithm for encoding said at least one floating point number based on said determined bit savings estimate for each of said plurality of predictions; and encoding said at least one floating point number by encoding one or more of said determined residual associated with said selected prediction algorithm and said determined bit savings estimate associated with said selected prediction algorithm.

14. A system for compressing at least one floating point number, comprising:

a memory; and at least one processing device, coupled to the memory, operative to implement the following steps:

obtaining said at least one floating point number comprising a sign, an exponent at a given base and a significand;

applying a default prediction algorithm and at least one other distinct prediction algorithm to said obtained at least one floating point number to generate a plurality of predictions;

determining a residual for each of said plurality of predictions based on a difference between said plurality of predictions and said at least one floating point number;

determining a bit savings estimate for each of said plurality of predictions based on a difference between an exponent of each said plurality of predictions and an exponent of said residual for each of said plurality of predictions;

selecting a given one of said default prediction algorithm and said at least one other distinct prediction algorithm for encoding said at least one floating point number based on said determined bit savings estimate for each of said plurality of predictions; and encoding said at least one floating point number by encoding one or more of said determined residual associated with said selected prediction algorithm and said determined bit savings estimate associated with said selected prediction algorithm.

15. The system of claim 14, further comprising the step of encoding an index of said at least one other distinct prediction algorithm when said at least one other distinct prediction algorithm is said selected prediction algorithm.

16. The system of claim 14, wherein a given one of said at least one other distinct prediction algorithm is selected based on whether said determined bit savings estimate for said given one of said at least one other distinct prediction algorithm is greater than a first threshold.

17. The system of claim 14, wherein a given one of said at least one other distinct prediction algorithm is selected based on whether a relative bit savings estimate for said given one of said at least one other distinct prediction algorithm with respect to said default prediction algorithm is greater than a second threshold.

18. The system of claim 14, further comprising the step of decompressing said encoded at least one floating point number by decoding said determined residual and said determined bit savings estimate associated with said selected prediction algorithm to determine whether said selected prediction algorithm was said default prediction algorithm or said at least one other distinct prediction algorithm.

19. The system of claim 18, further comprising one or more steps of reading an index of said at least one other distinct prediction algorithm when said selected prediction algorithm was said at least one other distinct prediction algorithm based on whether said decoded determined bit savings estimate for a given one of said at least one other distinct prediction algorithm is greater than a first threshold and on whether a relative bit savings estimate for said given one of said at least one other distinct prediction algorithm with respect to said default prediction algorithm is greater than a second threshold; and restoring the exponent of said determined residual by adding said decoded bit savings and the exponent of said selected prediction.

20. The system of claim 14, wherein one or more of said (i) default prediction algorithms; (ii) said at least one other distinct prediction algorithm; (iii) a first threshold value for said determined bit savings estimate for said at least one other distinct prediction algorithm; and (iv) a second threshold value for a relative bit savings estimate for said at least one other distinct prediction algorithm with respect to said default prediction algorithm are selected for a segment of a specific data set including said at least one floating point number.

* * * * *